(12) United States Patent
Schalberger et al.

(10) Patent No.: US 9,446,946 B2
(45) Date of Patent: Sep. 20, 2016

(54) METHOD FOR THE FABRICATION OF THIN-FILM TRANSISTORS TOGETHER WITH OTHER COMPONENTS ON A SUBSTRATE

(71) Applicant: UNIVERSITAET STUTTGART, Stuttgart (DE)

(72) Inventors: Patrick Schalberger, Magstadt (DE); Norbert Fruehauf, Sindelfingen-Darmsheim (DE); Marcus Herrmann, Neuffen (DE)

(73) Assignee: Universitaet Stuttgart, Stuttgart (DE)

( * ) Notice: Subject to any disclaimer, the term of this patent is extended or adjusted under 35 U.S.C. 154(b) by 0 days.

(21) Appl. No.: 14/862,504

(22) Filed: Sep. 23, 2015

(65) Prior Publication Data

US 2016/0107885 A1 Apr. 21, 2016

(30) Foreign Application Priority Data

Oct. 20, 2014 (DE) ......................... 10 2014 115 243

(51) Int. Cl.
| | | |
|---|---|---|
| *H01L 21/00* | (2006.01) | |
| *H01L 21/16* | (2006.01) | |
| *B81C 1/00* | (2006.01) | |
| *H01L 29/66* | (2006.01) | |
| *H01L 21/306* | (2006.01) | |
| *H01L 21/465* | (2006.01) | |
| *H01L 21/28* | (2006.01) | |
| *H01L 21/44* | (2006.01) | |
| *H01L 29/24* | (2006.01) | |
| *H01L 29/872* | (2006.01) | |
| *H01L 29/16* | (2006.01) | |

(52) U.S. Cl.
CPC ........... *B81C 1/00246* (2013.01); *H01L 21/28* (2013.01); *H01L 21/30604* (2013.01); *H01L 21/44* (2013.01); *H01L 21/465* (2013.01); *H01L 29/1604* (2013.01); *H01L 29/24* (2013.01); *H01L 29/247* (2013.01); *H01L 29/6609* (2013.01); *H01L 29/66143* (2013.01); *H01L 29/66757* (2013.01); *H01L 29/66969* (2013.01); *H01L 29/872* (2013.01); *B81C 2201/0133* (2013.01)

(58) Field of Classification Search
CPC .................. H01L 21/02664; H01L 29/78693; H01L 21/02565; H01L 29/66969; H01L 27/1225; H01L 27/1255; H01L 28/40; H01L 29/6675; H01L 27/13
USPC .............................. 438/104, 155; 257/43–57
See application file for complete search history.

(56) References Cited

U.S. PATENT DOCUMENTS

2007/0287233 A1 12/2007 Zhan et al.
2015/0349000 A1* 12/2015 Kim .................... H01L 27/1225
257/57

OTHER PUBLICATIONS

Eugene M. Chow et al: "High voltage thin film transistors . . . " The 13-th International Conference on Solid-State Sensors, Actuators and Microsystems, Seoul, Korea, Jun. 5-9, 2005, pp. 1318-1321.
Czang-Ho lee et al: "Process issues with Mo/ a-Si: H Schottky diode . . . " J. Vac. Sci. Technol. A 22 (5), Sep./Oct. 2004, pp. 2091-2095.

* cited by examiner

*Primary Examiner* — Charles Garber
*Assistant Examiner* — Abdulfattah Mustapha
(74) *Attorney, Agent, or Firm* — Michael J. Striker

(57) ABSTRACT

A method for the fabrication of thin-film transistors together with micromechanical components, other active electrical components or both on an amorphous or polycrystalline substrate includes disposing the thin-film transistors and the other components on different areas of the substrate.

11 Claims, 1 Drawing Sheet

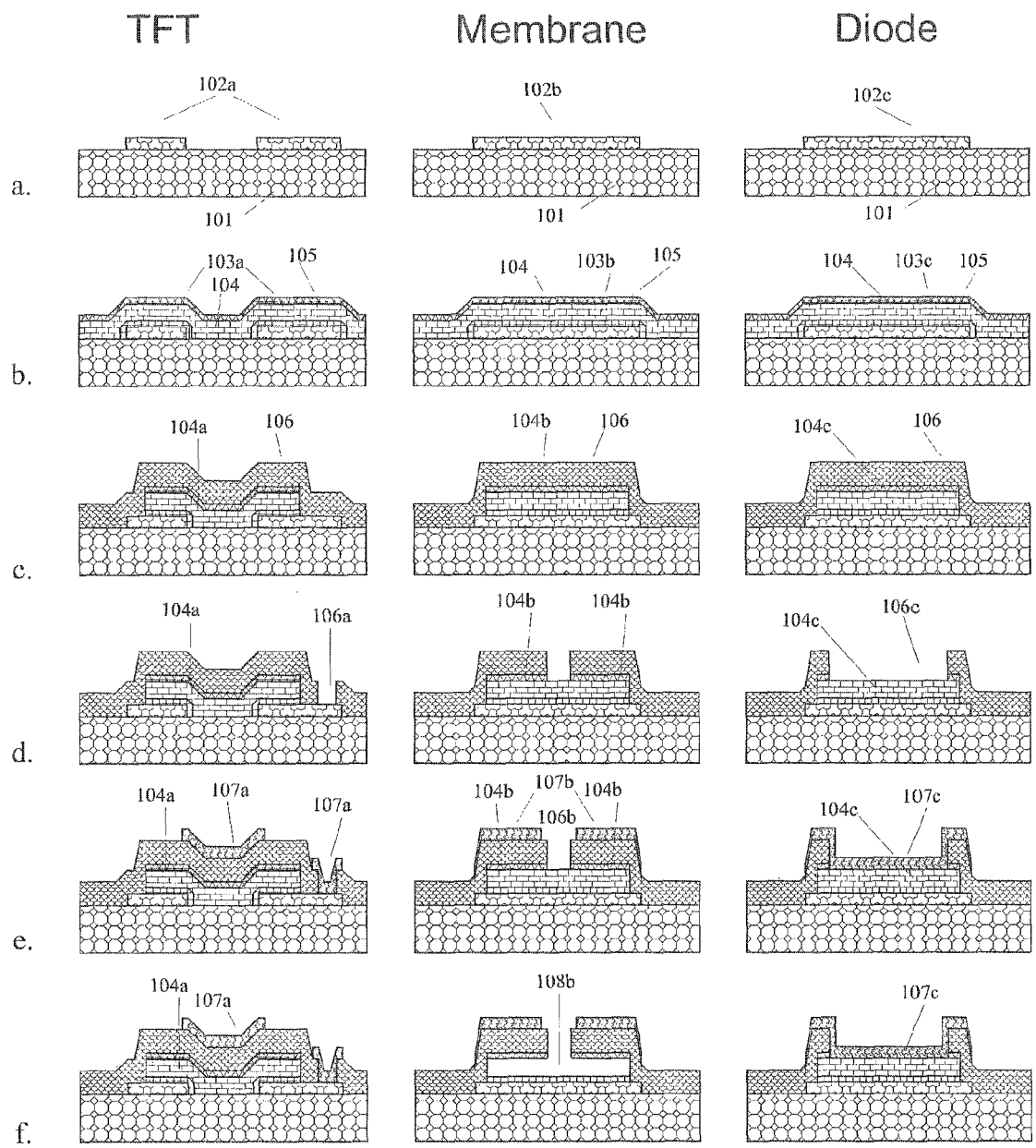

METHOD FOR THE FABRICATION OF THIN-FILM TRANSISTORS TOGETHER WITH OTHER COMPONENTS ON A SUBSTRATE

CROSS-REFERENCE TO A RELATED APPLICATION

The invention described and claimed hereinbelow is also described in German Patent Application DE 10 2014 115 243.3 filed on Oct. 20, 2014. This German Patent Application, subject matter of which is incorporated herein by reference, provides the basis for a claim of priority of invention under 35 U.S.C. 119(a)-(d).

BACKGROUND OF THE INVENTION

Thin-film transistors (TFTs) have been used successfully for several decades for the active control of large-area electro-optical systems such as displays and large-area sensors, e.g. x-ray sensors. More recent applications of these transistors relate to their use in micro-electromechanical systems (MEMS) and in RFID transponders (RFID tags).

Micro-electromechanical systems are being used increasingly in industry, for example, in acceleration sensors or electrically controllable micromirrors. There are basically two different types of MEMS fabrication processes: those in which the substrate (often a monocrystalline Si wafer) is used (or also used) to create the MEMS structures, and those in which all materials necessary to produce the MEMS structures are applied to a suitable substrate. This is usually done with typical processes used in thin-film technology, for example, by physical or chemical deposition from the vapour phase (PVD, CVD) or even by spin-on deposition. The structuring of micromechanical components is carried out mainly using established photolithographic processes used in the semiconductor industry.

The control of complex micro-electromechanical systems can be significantly simplified if active and possibly passive electronic and electrical components, such as transistors, diodes, resistors, capacitors etc., also are integrated on the same substrate in addition to the electromechanical components.

High-quality RFID transponders with high sensitivity require diodes with good rectification characteristics during a low voltage drop for rectification of the received electromagnetic alternating field.

In all these applications from thin-film transistors, the TFTs and the elements and/or additionally necessary components to be controlled by them have indeed until now been constructed on the same substrate, but successively, each using different structuring processes and stages.

Thus, for example, Lee, Czang-Ho and Vygranenko, Yuriy and Nathan, Arokia, "Process issues with Mo/a-Si:H Schottky diode and thin film transistors Integration for direct x-ray detection", Journal of Vacuum Science & Technology A, 22, 2091-2095 (2004) discloses a method in which Schottky diodes and bottom-gate (inverted staggered) a-Si:H transistors are fabricated successively on a substrate and are switched to one another.

Furthermore, in Chow, Eugene M., et al. "High voltage thin film transistors integrated with MEMS." Sensors and Actuators A: Physical 130, 297-301 (2006), a method is described in which the bottom-gate-a-Si:H transistors and MEMS cantilevers (bars) are fabricated successively on a substrate.

The known method therefore requires a large number of necessary process stages to fabricate the TFTs and the additional components, resulting in high manufacturing costs and a lower process yield.

SUMMARY OF THE INVENTION

The present invention overcomes the shortcomings of known arts, such as those mentioned above.

The invention provides a method that makes it possible for process stages to be saved in the fabrication of thin-film transistors together with further electrical components and/or micro-mechanical components.

In an embodiment, the invention provides a method for the fabrication of thin-film transistors together with micro-mechanical components and/or other active electrical components on an amorphous or polycrystalline substrate, wherein the thin-film transistors and the other components are each disposed on different areas of the substrate.

The method includes the following steps or process stages:

applying a first layer of an electrode material to the substrate;

structuring the first layer into drain and source electrodes in an area of transistors and into electrodes in an area of other electrical components;

after the step of structuring, applying a semiconductor layer, such as an amorphous or polycrystalline semiconductor layer;

structuring the semiconductor layer to at least partially cover the drain and source electrodes in the area of the transistors and in the area of the other electrical components, and to remain in an area of micromechanical components wherein the components are subsequently to have cavities;

after the step of applying an amorphous or polycrystalline semiconductor layer, depositing a dielectric layer that is structured to form a gate dielectric of the thin-film transistors in the area of transistors, structured to be at least partially uncovered above the electrodes in the area of the other electrical components and at least partially removed in the area of the micromechanical components above the semiconductor layer;

applying a second layer of an electrode material that is structured into gate electrodes of the transistors, that is structured into second electrodes in the area of the other electrical components in areas above the semiconductor layer and above the first electrodes and is completely removed in the area of the micromechanical components; and etching away the semiconductor layer in the area of the micromechanical components.

The thin-film transistors fabricated using this method have drain/source electrodes at the bottom and a gate electrode at the top. The process stages or steps for fabricating thin-film transistors are used at the same time to fabricate the additional components. The additional electrical components may (for example) be metal semiconductor diodes (Schottky diodes). Possible examples of freestanding micromechanical structures may be (but are not restricted to) bars and membranes. Synthetic foils or wafers made from ceramic, quartz, fused silica or glass may be used as substrates.

A feature of the inventive method includes that the amorphous or polycrystalline semiconductor layer, in which the conductive channel of the thin-film transistors is formed when corresponding voltages are applied to the gate electrode, likewise serves as an active semiconducting layer of the electrical components such as Schottky diodes and/or as a sacrificial layer in the fabrication of freestanding micromechanical structures.

In a variant of the method, the first layer of electrode material is also structured into electrodes from an electrode material in the area of the micromechanical components. This is advantageous if the micromechanical components are electromechanical structures. In this case, in the second step of applying and structuring the second layer of electrode material, the second layer is structured into electrodes from an electrode material in the area of the micromechanical components, such electrodes at least partially covering the semiconductor layer.

The semiconductor layer in the area of the micromechanical components may advantageously be etched away using KOH. Amorphous or polycrystalline silicon may be used as the semiconductor material. However, tetramethylammonium hydroxide solution can also be used as the etching medium.

In an embodiment of the method, however, an amorphous or polycrystalline metal oxide, which contains more than 10 percent by weight of indium oxide and/or gallium oxide and/or zinc oxide and/or tin oxide, is used as the semiconductor material.

Other advantages are achieved if an injection layer is applied to the first electrodes after the step of applying the first layer of an electrode material. The electrical properties of the transistors are considerably improved with such an injection layer.

The injection layer may be formed, for example, as a doped semiconductor layer, which is advantageously deposited selectively on the first electrode.

BRIEF DESCRIPTION OF THE DRAWINGS

A preferred embodiment of an inventive method is described in greater detail below with reference to the drawing FIGURE. The illustration therein shows the different process stages in a sequence of illustrations (a-f) of cross-sections through a substrate with layers successively applied to and structured on the substrate.

DETAILED DESCRIPTION OF THE PREFERRED EMBODIMENTS

The following is a detailed description of example embodiments of the invention depicted in the accompanying drawing FIGURE. The example embodiments are presented in such detail as to clearly communicate the invention and are designed to make such embodiments obvious to a person of ordinary skill in the art. However, the amount of detail offered is not intended to limit the anticipated variations of embodiments; on the contrary, the intention is to cover all modifications, equivalents, and alternatives falling within the spirit and scope of the present invention, as defined by the appended claims.

Thin-film transistors, preferably n-channel thin-film transistors (TFTs) 102a, are fabricated in first areas on a common substrate 101, while micromechanical components, for example bars and membranes (Membrane) 102b, are fabricated in second areas, and additional electrical components, in this case metal semiconductor diodes (Diode) 102c, are fabricated in third areas. Typical layering and structuring processes used in thin-film technology, such as physical and chemical vapour deposition, electrolytic deposition, spin-coating, photolithography, dry and wet-chemical etching, etc., can be used for the fabrication of these various components.

In greater detail the drawing FIGURE comprises, from top to bottom, lines representative of various stages (a-f) of the fabrication process. Each of the processing stages as shown are separated into the three columns representing the corresponding areas in which the thin-film transistors (TFT), the bars and membranes (Membrane) and the additional semiconductor component, preferably diodes (Diode), are fabricated.

In each of the areas (TFT, Membrane and Diode), firstly the complete deposition of an electrode material, preferably a metal such as a molybdenum-tantalum alloy (MoTa) with a tantalum proportion of less than 20 atomic percent, onto an amorphous or polycrystalline substrate 101 and the structuring of this layer in the first areas (TFT) into drain/source electrodes 102a for the thin-film transistors is carried out.

In the areas of the second type (Membrane), ground electrodes 102b for the micromechanical components are fabricated from the same electrode material. In the third areas (Diode), the first layer of electrode material is structured into ground electrodes 102c, preferably into cathodes for Schottky diodes. The skilled artisan should recognize, however, that instead of a single (first) layer of electrode material, a dual or multiple layer may instead be deposited and structured accordingly.

Depending on the requirements of the semiconductor to be used, an injection layer 103a (TFT), 103b (Membrane), 103c (Diode), preferably a doped semiconductor, may be deposited on the electrode material and structured together with or after the electrode material, or selectively deposited on the already structured drain/source electrodes 102a, the ground electrodes 102c and possibly on the ground electrodes 102b.

An amorphous or polycrystalline semiconductor layer 104, preferably amorphous or polycrystalline silicon or an amorphous or polycrystalline metal oxide, which contains more than 10 percent by weight of indium oxide and/or gallium oxide and/or zinc oxide and/or tin oxide, is then deposited over the whole area. Depending on the semiconductor used, particularly if amorphous silicon is used as the semiconductor, a thin layer 105 of a dielectric material, preferably silicone nitride or silicone oxide, is deposited over this semiconductor layer.

The semiconductor layer 104 and possibly the dielectric material 105 are then structured in the first areas (TFT) such that at least two electrodes 103a are at least partially covered by the resulting semiconductor areas 104a, between which a conducting channel can form in the subsequent thin-film transistor. At the same time, the semiconductor 104 and possibly the dielectric material 105 are structured in the second areas (Membrane) such that semiconductor areas 104b remain at least where the micromechanical component is to have cavities. In the third areas (Diode), the semiconductor 104 and possibly the dielectric material 105 are structured in the same process stage such that at least one part of the resulting semiconductor areas 104c is disposed directly above the electrodes 102c and is in direct contact with them and/or with any existing injection layer 103c.

A dielectric layer 106, preferably silicone nitride or silicone oxide, is then deposited over the whole area and structured in the second (TFT) and third (Diode) areas such that openings 106b, 106c at least partially expose the semiconductor areas 104b, 104c. If necessary, a structuring may take place in the first areas (TFT) such that openings 106a are created, which likewise expose parts of the electrodes 102a.

In the further process stage, an electrode material, preferably a metal, particularly a molybdenum-tantalum alloy (MoTa) with a tantalum proportion of less than 20 atomic percent, is deposited over the whole area and is structured in the first area (TFT) such that gate-electrodes 107a are created. The gate electrodes 107a completely cover the required channel areas of the resulting thin-film transistors and at least partially cover the drain/source electrodes 102a.

In an embodiment, the electrodes 107a completely cover the semiconductor areas 104a, in order additionally to protect the semiconductor areas 104a in the first areas (TFT) from penetrative etching agents in the subsequent process for the free-etching of cavities 108b. Where openings 106a exist in the dielectric in areas of the first type (TFT), the electrode material may additionally be structured such that metallizations 107a are present in the area of these openings.

In the second areas (Membrane), the electrode material is at the same time structured such that electrodes 107b are created at least partially above the semiconductor areas 104b and at the same time are completely or partially omitted at least above the openings in the dielectric 106b.

In the same process stage, the electrode material is structured in the third areas (Diode) such that the electrodes 107c are created, which are located at least partially above the semiconductor areas 104c and at the same time cover the openings in the dielectric 106c.

The skilled artisan should note that instead of a single layer of electrode material, a dual or multiple layer also may be deposited and structured accordingly. In particular, the electrode material may be made particularly resistant to the etching agent in the subsequent free-etching process of cavities 108b by a top layer made from a particularly precious material, especially gold, silver, palladium or platinum.

In a further process stage, etching is carried out thereafter using a suitable etching agent in the second areas (Membrane) of the semiconductors 104b through the openings in the dielectric 106b such that cavities 108b are created instead of the semiconductor areas 104b. At the same time, in the first areas (TFT), the semiconductor areas 104a are protected from the etching medium by the dielectric 106 and possibly by the electrodes 107a covering the semiconductor areas.

The dielectric 106 is thus used in the first areas (TFT) as a gate dielectric, while in the second area (Membrane) self-supporting structures such as bars or membranes are fabricated from the same layer.

In the third area (Diode) the semiconductor areas 104c below the openings in the dielectric 106c are protected from the etching medium by the electrode material, preferably of correspondingly structured electrodes 107c.

This etching medium may be inter alia an acid or alkali. In a process variant, an aqueous solution of potassium hydroxide or tetramethylammonium hydroxide, preferably at elevated temperatures, particularly a temperature of between 60° C. and 100° C., or a tetramethylammonium hydroxide solution, is used as the etching medium.

The invention also comprises methods in which only thin-film transistors and additional electrical components or only thin-film transistors and micromechanical elements are fabricated. The structuring stages described above are then omitted for the components that are not present.

All embodiments of the invention may of course be supplemented by further process stages. For example, further electrode materials may be deposited and structured if this is necessary for the fabrication of components with the desired properties. Thus, for example, the electrodes 102b, 107b of the micromechanical components deposited together with the electrodes of the thin-film transistor may be replaced by transparent electrodes if required.

Furthermore, the invention is not limited to the fabrication of the components described in the exemplary embodiment. Thus, for example, it also covers the fabrication of passive electrical components such as capacitors, resistors or inductive components.

As will be evident to persons skilled in the art, the foregoing detailed description and FIGURES are presented as examples of the invention, and that variations are contemplated that do not depart from the fair scope of the teachings and descriptions set forth in this disclosure. The foregoing is not intended to limit what has been invented, except to the extent that the following claims so limit that.

What is claimed is:

1. A method for the fabrication of thin-film transistors together with micromechanical components, other active electrical components or both on an amorphous or polycrystalline substrate, wherein the thin-film transistors and the other active electrical components are each disposed on different areas of the substrate, the method comprising the stapes of:
    applying a first layer of an electrode material to the substrate;
    structuring the first layer into drain and source electrodes in an area of the thin-film transistors and into electrodes in an area of other electrical components;
    after structuring the first layer, applying a semiconductor layer;
    structuring the semiconductor layer such that the drain and source electrodes in the area of the transistors and the electrodes in the area of the other electrical components remain at least partially covered by the semiconductor layer, and that micromechanical components in an area of micromechanical components that are subsequently to have cavities remain covered;
    depositing a dielectric layer;
    structuring the dielectric layer to a gate dielectric of the thin-film transistors in the area of the transistors, at least partially covering the semiconductor layer above the electrodes in the area of the other electrical components and at least partially removing the semiconductor layer above the micromechanical components in the area of the micromechanical components;
    applying a second layer of an electrode material;
    structuring the second layer of electrode material into gate electrodes in the area of the transistors, into second electrodes in areas above the semiconductor layer and above the first electrodes (102c) the area of the other electrical components in and into electrodes that at least partially cover the semiconductor layer in the area of the micromechanical components; and
    etching away the semiconductor layer in the area of the micromechanical components.

2. The method according to claim 1, wherein the other electrical components are fabricated as metal semiconductor diodes.

3. The method according to claim 1, wherein the step of structuring the first layer includes forming electrodes in the area of the micromechanical components.

4. The method according to one of claim 1, wherein potassium hydroxide (KOH) is utilized to etch away the semiconductor layer in the area of the micromechanical components.

5. The method according to one of claim 1, wherein tetramethylammonium hydroxide solution is utilized to etch away the semiconductor layer in the area of the micromechanical components.

6. The method according to claim 1, wherein the step of structuring the second layer, the electrode material is completely removed in the area of the micromechanical components.

7. The method according to claim 1, wherein the semiconductor material comprising the semiconductor layer is amorphous or polycrystalline silicon.

8. The method according to claim 1, wherein the semiconductor material comprising the semiconductor layer is an amorphous or polycrystalline metal oxide, which contains more than 10 percent by weight of indium oxide and/or gallium oxide and/or zinc oxide and/or tin oxide.

9. The method according to claim 1, further comprising applying an injection layer to the first electrodes before applying the semiconductor layer.

10. The method according to claim 9, wherein a doped semiconductor layer is applied as the injection layer.

11. The method according to claim 10, wherein the doped semiconductor layer is selectively deposited on the drain and source electrodes in the area of the thin-film transistors and on the electrodes in an area of other electrical components.

* * * * *